United States Patent
Martin

(10) Patent No.: US 6,526,374 B1
(45) Date of Patent: Feb. 25, 2003

(54) FRACTIONAL PLL EMPLOYING A PHASE-SELECTION FEEDBACK COUNTER

(75) Inventor: David G. Martin, Bethlehem, PA (US)

(73) Assignee: Agere Systems Inc., Allentown, PA (US)

(*) Notice: Subject to any disclaimer, the term of this patent is extended or adjusted under 35 U.S.C. 154(b) by 0 days.

(21) Appl. No.: 09/460,169

(22) Filed: Dec. 13, 1999

(51) Int. Cl.[7] .................................. G06F 3/00
(52) U.S. Cl. .................. 703/14; 703/5; 703/1; 375/376; 327/156
(58) Field of Search .............. 703/1, 5, 14; 327/161, 327/166, 156, 147, 163; 375/374, 376; 331/14, 2, 25

(56) References Cited

U.S. PATENT DOCUMENTS

| | | | | |
|---|---|---|---|---|
| 5,727,038 A | * | 3/1998 | May et al. ............ | 375/376 |
| 5,889,436 A | * | 3/1999 | Yeung et al. ......... | 331/2 |
| 6,075,395 A | * | 6/2000 | Saeki .................. | 327/161 |
| 6,114,914 A | * | 9/2000 | Mar .................... | 331/16 |
| 6,380,774 B2 | * | 4/2002 | Saeki .................. | 327/119 |
| 6,396,320 B2 | * | 5/2002 | Saeki .................. | 327/156 |

OTHER PUBLICATIONS

"Charge–Pump Phase–Lock Loops," by Floyd M. Gardner, IEEE Trans. Commun. vol. COM–28, No. 11, Nov. 1980, pp. 321–329.

* cited by examiner

Primary Examiner—Kevin J. Teska
Assistant Examiner—T. Phan
(74) Attorney, Agent, or Firm—Steve Mendelsohn; Ian M. Hughes

(57) ABSTRACT

A phase-locked loop (PLL) employs a ring oscillator for the voltage-controlled oscillator (VCO), and the ring oscillator comprises an odd number of inverting stages operating at a given frequency. The frequency of the ring oscillator is determined by the delay through each stage and the number of stages. The output signal of each stage has a phase determined by the number of stages, and each stage provides its output signal with a different phase. The VCO of the PLL selects phases of the ring oscillator to clock the counter of the feedback divider of the PLL. Each phase is selected by a multiplexer (mux) under the control of a finite state machine that monitors the output of the counter. When the counter completes a full count cycle on one phase of the ring oscillator, the finite state machine selects a different phase of the ring oscillator to clock the counter for the next count cycle. The phase selected advances or delays the start of the next count cycle by the delay of one or more stages of the ring oscillator. Thus, for a PLL having a three-stage ring oscillator and a mux selecting the phase from each stage sequentially (first to last) for every count cycle, the effective count of the counter is $(V+\frac{1}{3})$ or $(N-\frac{1}{3})$, as opposed to N, depending on whether the selected phase delays or advances the start of the next count cycle.

14 Claims, 5 Drawing Sheets

FRACTIONAL PLL EMPLOYING A PHASE-SELECTION FEEDBACK COUNTER

BACKGROUND OF THE INVENTION

1. Field of the Invention

The present invention relates to phase-locked loop (PLL) circuits, and, more particularly, to phase selection in a fractional-N PLL circuit.

2. Description of the Related Art

A phase-locked loop (PLL) is a circuit that generates, or synthesizes, a periodic output signal that has a constant phase and frequency with respect to a periodic input signal. PLLs are widely used in many types of measurement, microprocessor, and communication applications. One type of phase-locked loop is the charge-pump PLL, which is described in Floyd M. Gardner, "Charge-Pump Phase-Lock Loops" *IEEE Trans. Commun.*, vol. COM-28, pp. 1849–1858, November 1980, the teachings of which are incorporated herein by reference. Usually, the frequency of the output signal is higher than the frequency of the input signal.

FIG. 1 shows a block diagram of a conventional charge-pump phase-locked loop 100. Phase detector (PD) 102 compares the phase $_{IN}$ of the input signal $F_{IN}$ to the phase $_{OUT}$ of the feedback signal $F_{OUT}$ and generates an error signal: either an UP signal U (when $_{IN}$ leads $_{OUT}$) or a DOWN signal D (when $_{OUT}$ leads $_{IN}$), where the width of the error signal pulse indicates the magnitude of the difference between $_{IN}$ and $_{OUT}$.

Charge pump 104 generates an amount of charge equivalent to the error signal (either U or D) from PD 102. Depending on whether the error signal was an UP signal or a DOWN signal, the charge is either added to or subtracted from the capacitors in loop filter 106. For purposes of this explanation, loop filter 106 has a relatively simple design, consisting of a capacitor $C_S$ in parallel with the series combination of a resistor R and a relatively large capacitor $C_L$. As such, loop filter 106 operates as an integrator that accumulates the net charge from charge pump 104. Other, more-sophisticated loop filters are, of course, also possible. The resulting loop-filter voltage $V_{LF}$ is applied to voltage-controlled oscillator (VCO) 108. A voltage-controlled oscillator is a device that generates a periodic output signal ($F_{OUT}$ in FIG. 1), whose frequency is a function of the VCO input voltage ($V_{LF}$ in FIG. 1). In addition to being the output signal from PLL 100, the VCO output signal $F_{OUT}$ is used as the feedback signal for the closed-loop PLL circuit.

Optional input and feedback dividers 110 and 112 may be placed in the input and feedback paths, respectively, if the frequency of the output signal $F_{OUT}$ is to be either a fraction or a multiple of the frequency of the input signal $F_{IN}$. If not, the input and feedback dividers 110 and 112 may both be considered to apply factors of 1 to the input and feedback signals, respectively.

When input and feedback dividers 110 and 112 are employed, the PLL output signal's frequency $F_{OUT}$ is related to the input signal's frequency $F_{IN}$ based on the counter value (R) of input divider 110 and the counter value (N) of feedback divider 112. The relationship between the output signal frequency $F_{OUT}$ and the input signal frequency $F_{IN}$ may be as given in equation (1):

$$F_{OUT} = \frac{N}{R} F_{IN}. \tag{1}$$

In some PLL's of the prior art, the input and feedback dividers 110 and 112 are digital counter circuits and N and R are usually integers. However, in some applications, N may be an integer plus a fraction, such as 66⅔, and a PLL of such applications is known in the art as a fractional-N PLL. A fractional-N PLL may be implemented by having the counter value N of the feedback divider 112 switch between two different values such that the average of the two values is the desired fractional count. This scheme has the disadvantage of introducing large, instantaneous phase errors into the PD 102 whenever the value of N changes that must be corrected, usually requiring relatively complex analog circuitry.

A ring oscillator is commonly used as the VCO 108 of PLL 100. A ring oscillator has an odd number of inverting stages, each inverting stage operating at a frequency determined by the delay through each inverting stage and the number of inverting stages in the ring oscillator. For a three-stage ring oscillator, the periodic output signals of the three inverters are 120° out of phase with each other, so the delay through one inverter is ⅓ of the period of the ring oscillator's output signal period. In PLLs of the prior art, one phase of the ring oscillator is employed to clock the counter of the divider, and the output signal of the counter is the output signal of the ring oscillator divided by the value of the counter.

SUMMARY OF THE INVENTION

The present invention relates to phase-locked loop (PLL) circuits comprising a feedback divider whose count-by-N counter is clocked with selected signal phases of the PLL output signal, the selected signal phases generated by stages of a ring oscillator of the VCO of the PLL. Since the delay added to starting the counter in the feedback path may be equivalent as each phase is selected, the phase detector of the PLL does not receive a disjoint signal from the feedback path that causes large, instantaneous phase errors An exemplary embodiment of the invention includes a phase detector (PD), a voltage controlled oscillator (VCO), a multiplexer, and a feedback divider. The PD generates a PLL PD signal based on a difference in phase between a PLL input signal and a PLL feedback signal, wherein a circuit generates a control voltage from the PLL PD signal. The VCO generates a PLL output signal having a frequency and phase based on the control voltage, the VCO including a ring oscillator having a plurality of stages and each stage providing a corresponding signal phase of the PLL output signal. The multiplexer receives two or more signal phases of the ring oscillator and providing one signal phase based on a select signal generated from the PLL feedback signal. The feedback divider clocks a count-by-N counter (N a positive integer) with the signal phase provided by the multiplexer to generate the PLL feedback signal, wherein the counter 1) divides the signal corresponding to the selected signal phase during a cycle of N counts and 2) delays or advances the next cycle of N counts based on a difference between the current and next signal phase provided by the multiplexer.

BRIEF DESCRIPTION OF THE DRAWINGS

Other aspects, features, and advantages of the present invention will become more fully apparent from the following detailed description, the appended claims, and the accompanying drawings in which:

DETAILED DESCRIPTION

Figure 2:
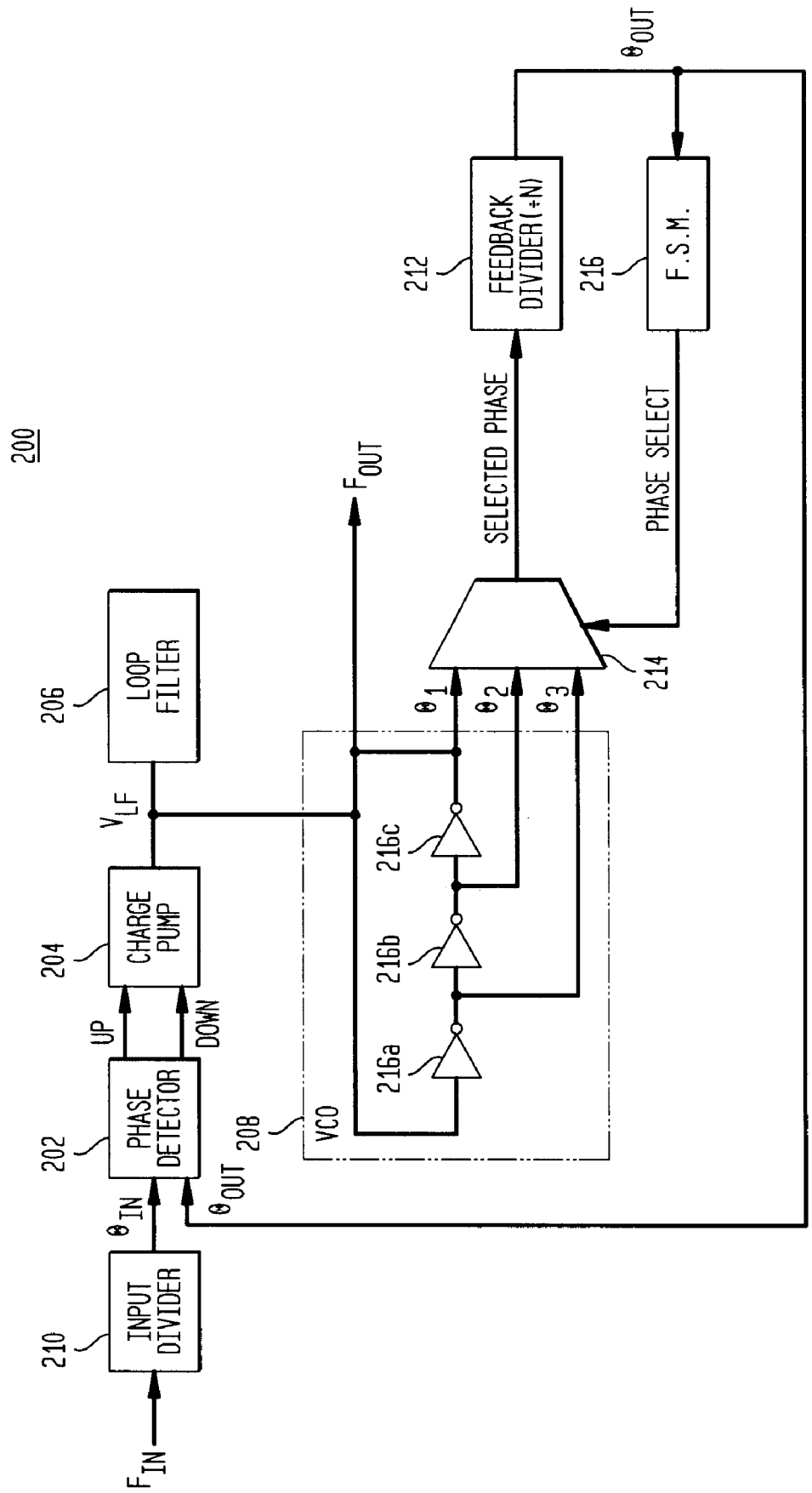
FIG. 2 shows a block diagram of a fractional-N phase-locked loop in accordance with an exemplary embodiment of the present invention.

FIG. 2 shows a block diagram of a fractional-N phase-locked loop 200 in accordance with an exemplary embodiment of the present invention. Phase detector (PD) 202 compares the phase $_{IN}$ of the input signal having frequency $F_{IN}$ to the phase $_{OUT}$ of the feedback signal and generates an error signal that indicates the magnitude of the difference between $_{IN}$ and $_{OUT}$. Charge pump 204 generates an amount of charge equivalent to the error signal, and loop filter 206 operates as an integrator that accumulates the net charge from charge pump 204 to generate loop-filter voltage $V_{LF}$ applied to voltage-controlled oscillator (VCO) 208. VCO 208 generates the output signal with frequency $F_{OUT}$ based on the loop-filter voltage $V_{LF}$. As shown in FIG. 2, VCO 208 is a ring oscillator having three inverting stages 216a–216c, although a ring oscillator having more or fewer stages may be employed for VCO 208. Input divider 210 may be placed in the input path and includes a count-by-R counter to divide a periodic input signal with frequency $F_{IN}$ by R. Multiplexer 214 and feedback divider 212 are placed in the feedback path, and feedback divider 212 includes a count-by-N counter to divide its input signal by N. Using signals generated by VCO 208, feedback divider 212 generates the PLL feedback signal with phase $_{OUT}$ provided to the PD 202.

The ring oscillator of VCO 208 comprises an odd number of inverting stages 216a–216c to provide the VCO output signal. For example, a ring oscillator may comprise three CMOS inverters. The output signal of each stage has a periodic signal at the frequency of the ring oscillator but with a phase determined by the number of stages. Each stage provides its output signal with a different phase with respect to the other stages based on its position in the ring. Since the odd number of stages provide an odd number of signal phases, one or more non-inverting stages may be added to the ring oscillator to provide an even number of signal phases. The ring oscillator operates at a frequency determined by the delay through a single stage and by the number of stages. As shown in FIG. 2, the output signal of one of the stages 216a–216c (e.g., the output of the last stage 216c) is used as the output signal of the VCO 208 with frequency $F_{OUT}$. The phases of the output signals from the stages 216a–216c for the exemplary implementation shown in FIG. 2 (termed herein as output signal phases $_{1-3}$) are 120° out-of-phase with each other. However, one skilled in the art could extend the design of the ring oscillator to provide any phase difference desired with a combination of an odd number of inverting stages and, if necessary, one or more non-inverting stages.

One or more signal phases $_{1-3}$ of the ring oscillator are provided to multiplexer (mux) 214. One of the signal phases $_{1-3}$ of the ring oscillator is selected by the mux 214 based on a select (or "state") signal of finite-state machine (FSM) 216. The selected signal phase $_1$, $_2$, or $_3$ is used to clock the count-by-N counter of feedback divider 212. After the counter has completed a full cycle (e.g., N counter increments) using one (i.e., the currently selected) signal phase of the ring oscillator, FSM 216 generates a state signal to mux 214 to select a different phase of the ring oscillator to clock the counter for the next count cycle. For the exemplary implementation, FSM 216 operates on an edge of the output signal of the counter.

For the exemplary implementation of FIG. 2, the phase $_1$, $_2$, or $_3$ selected by mux 214 advances or delays the start of the next count cycle by an amount substantially equivalent to the delay of a corresponding number of stages of the ring oscillator. Thus, for a three-stage ring oscillator where the selected signal phase comes from one stage later every count cycle (i.e., the selected signal phase lags), the effective count of the counter of feedback divider 212 is (N+(⅓)). Conversely, if the selected phase advances by one stage after each count cycle, the effective count is (N−(⅓)) (i.e., the selected signal phase leads). When more than three stages are employed for the ring oscillator, the advance or delay selected with the mux 214 may be equivalent to one or more stage delays.

As shown in FIG. 2, FSM 216 generates the state signal based on the output signal of feedback divider 212. As would be apparent to one skilled in the art, FSM 216 may also receive one or more of the signal phases of the ring oscillator to generate a state signal having states corresponding to desired operation of the feedback divider. In addition, as described subsequently, a control signal may also be employed to select the operation of the feedback divider to configure the PLL circuit as either a divide by N, or as a fractional-N PLL (with either leading or lagging signal phases).

Figure 3:
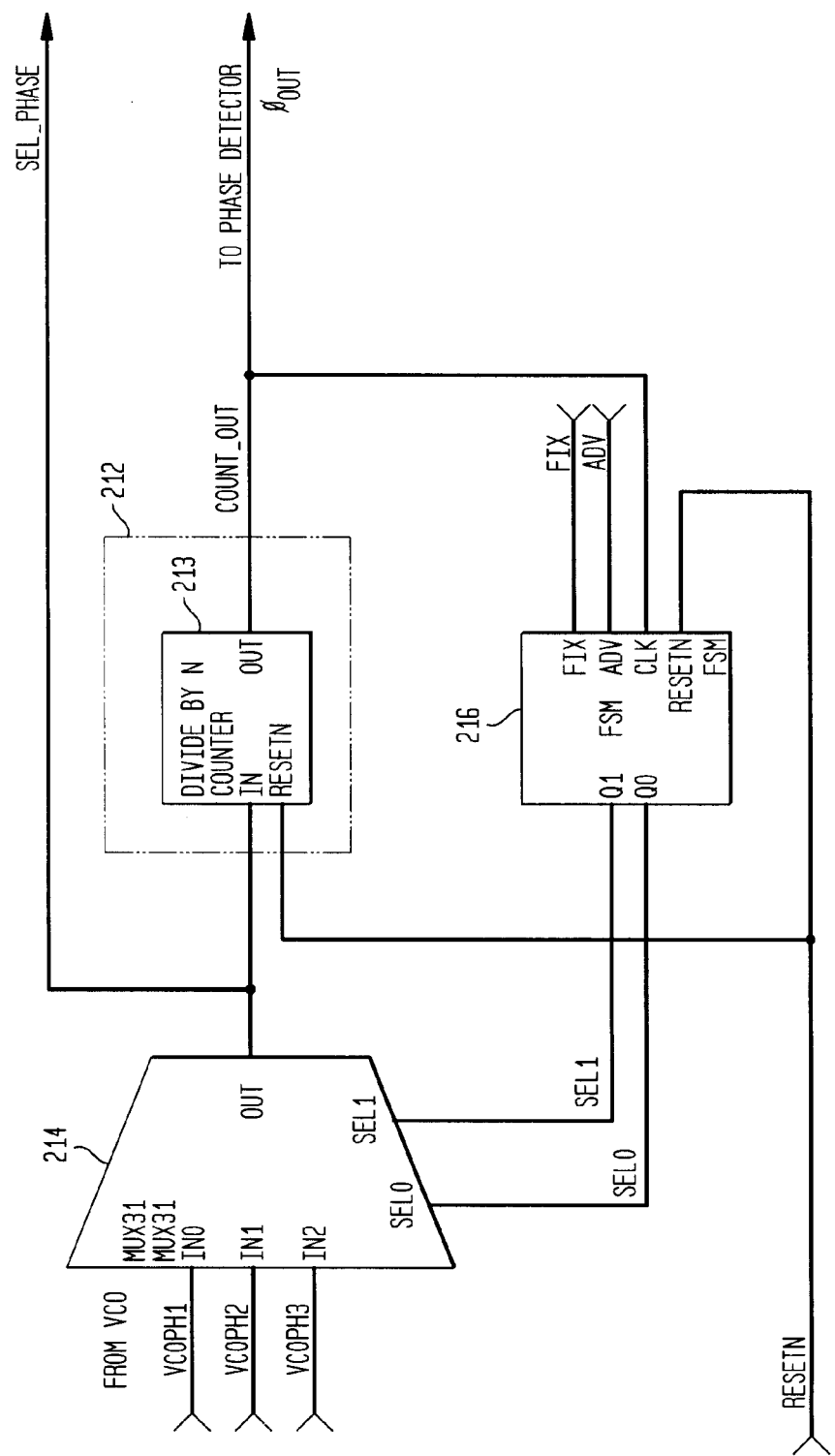
FIG. 3 shows a logic circuit schematic including multiplexer, feedback divider, and finite state machine of an exemplary implementation of a divide by 3⅔ feedback divider.
Figure 4:
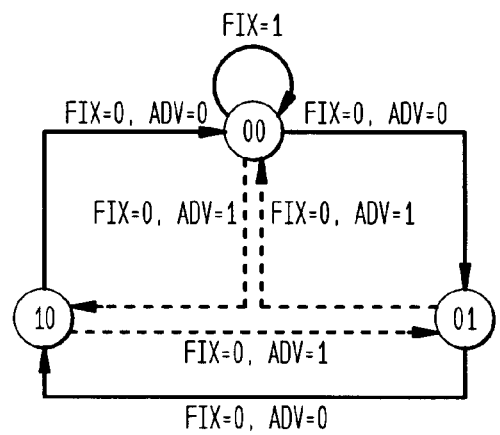
FIG. 4 shows a state transition diagram for the finite state machine of FIG. 3.

FIG. 3 shows a logic circuit schematic including mux 214, count-by-N counter 213 of the feedback divider 212, and FSM 216 of an exemplary implementation of a fractional-N PLL with N=4. The exemplary implementation selectively divides the PLL output signal by either 11/3 or by 10/3 to generate the PLL feedback signal to PD 202. FIG. 4 shows a state transition diagram employed for FSM 216 of FIG. 3 where FSM 216 receives two control input values: FIX and ADV. When the control input value FIX is logic high (i.e., FIX=1), only one signal phase is used to clock the count-by-N counter. When FIX is logic high, the feedback divider operates as a divide-by-4 to generate the PLL feedback signal (i.e., the PLL operates in a manner similar to the PLL shown in FIG. 1). When FIX is logic low (i.e., FIX=1), the value of control input value ADV determines whether the selected phase lags (ADV=0) or leads (ADV=1). Given the control input values for FIX and ADV, the states are generated as two values SEL1 and SEL0 to sequentially select the corresponding signal phases (VCOPH1–VCOPH3). For the exemplary embodiment, state "00" corresponds to selecting the first stage's signal phase (i.e., SEL1=0 and SEL0=0 causes mux 214 to select VCOPH1). Similarly, state "01" corresponds to selecting the second stage's signal phase (i.e., SEL1=0 and SEL0=1 causes mux 214 to select VCOPH2), and state "10" corresponds to selecting the third stage's signal phase (i.e., SEL1=1 and SEL0=0 causes mux 214 to select VCOPH3).

Figure 5:
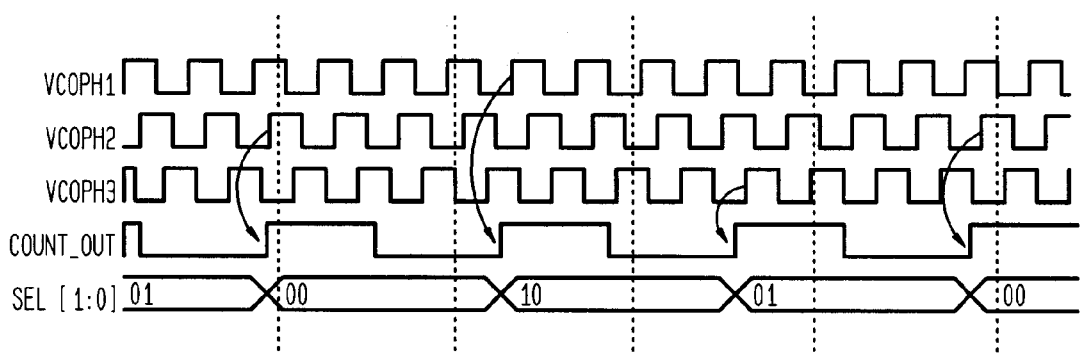
FIG. 5 shows a timing diagram for the exemplary implementation of FIG. 3.
Figure 6:
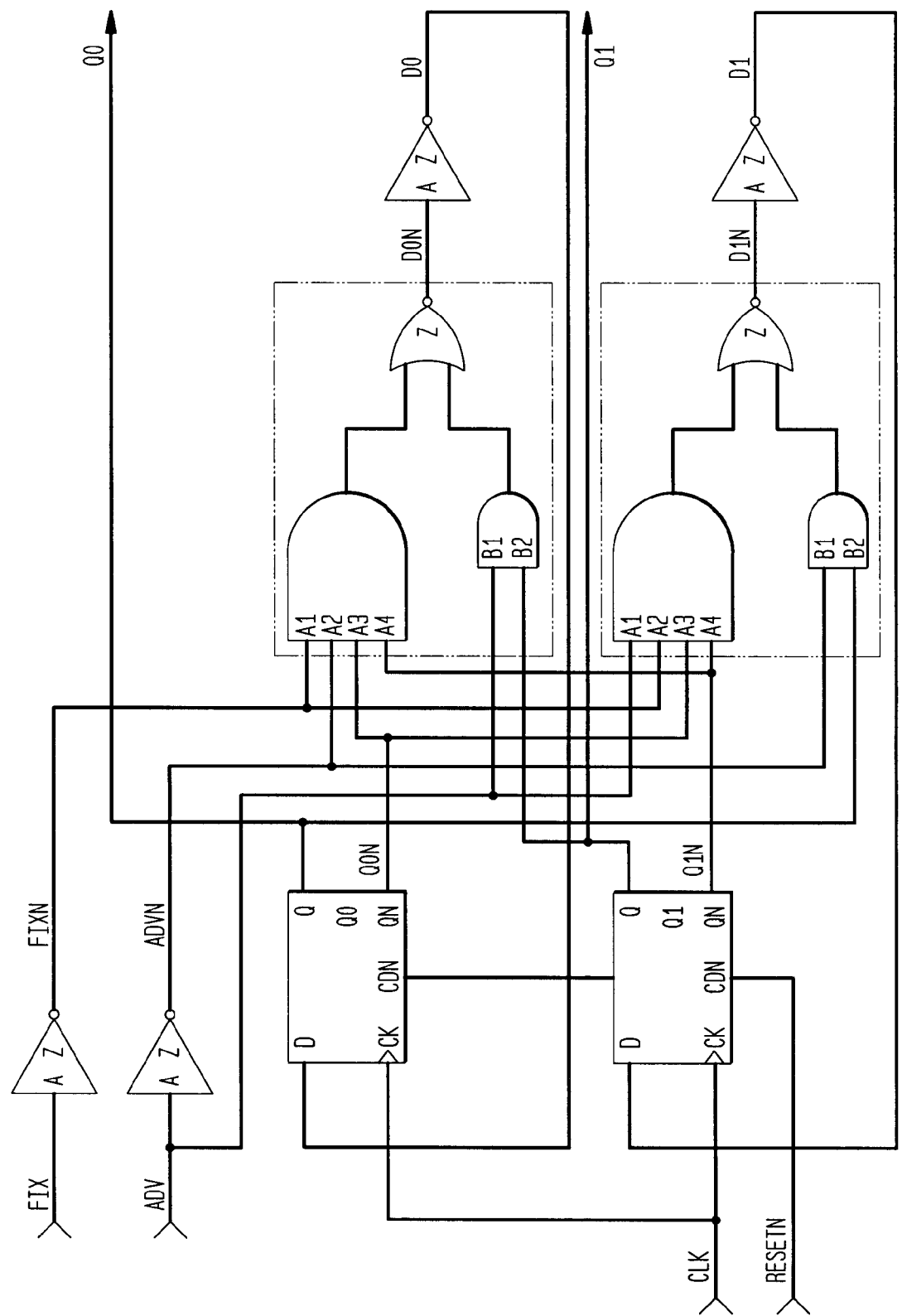
FIG. 6 shows a circuit logic circuit schematic for the finite state machine shown in FIGS. 3 and 4.

FIG. 5 shows a corresponding timing diagram showing the selection of the signal phase $_{1-3}$ (VCOPH1–VCOPH3)

using the sequence of values of state signal (comprising SEL1 and SEL0) to provide overall divide by 1⅓ in the PLL feedback path. The arrows in FIG. 5 indicate the transitions between the signal phases to clock the count-by-N counter that provides the fractional-N output count (PLL feedback signal) COUNT_OUT. FIG. 6 shows a circuit logic circuit schematic for the finite state machine shown in FIG. 3 implementing the state transition diagram of FIG. 4 using the control input values to generate the state signal (i.e., SEL1 and SEL0).

Thus, a fractional-N PLL may be implemented in accordance with the present invention that maintains phase alignment of the phase detector while avoiding complex analog compensation circuitry. Since the delay added to starting the counter in the feedback path may be equivalent as each phase is selected, the PD 202 does not receive a disjoint signal from the feedback path that causes large, instantaneous phase errors such as encountered in fractional-N PLLs of the prior art.

Figure 1:
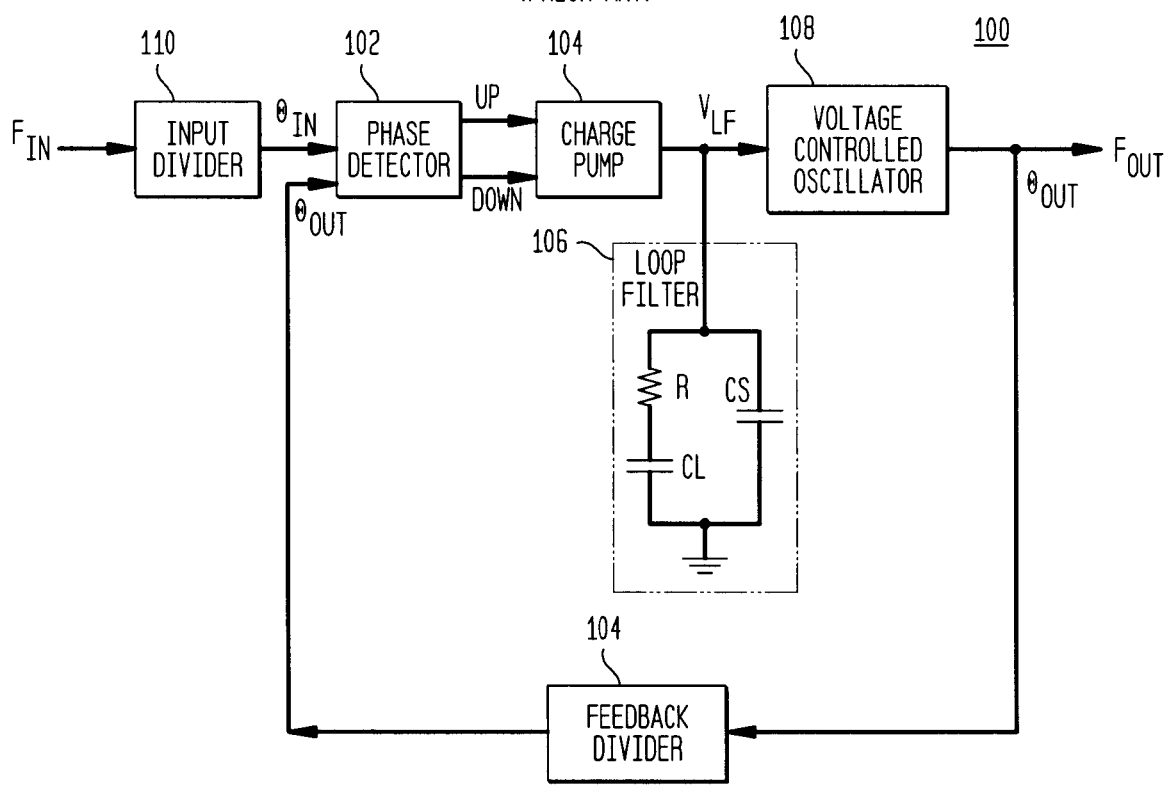
FIG. 1 shows a block diagram of a conventional charge-pump phase-locked loop of the prior art.

In addition, selecting two or more phases of a ring oscillator allows for relatively simple PLL circuit design when compared to a fractional PLL circuit of the prior art. For example, using the exemplary embodiment of FIG. 2 to generate a 48-MHz PLL output signal from a 19.44-MHz PLL input signal, a PLL of the prior art such as shown in FIG. 1 may require an input divider with a counter value R of 81 and a feedback divider with a counter value N of 200. Consequently, the phase detector operates at 240-KHz ((19.44 MHz/81)=(48/200)). An exemplary implementation of the present invention may generate a 48-MHz output frequency from a 19.44-MHz input as follows. The input divider counter value R may be set to 27 and the feedback divider counter value N may be set to 66⅔. Consequently, the phase detector operates at 720-KHz with near-ideal phase alignment. Operating a phase detector at a higher frequency simplifies the analog circuit design, allowing the use of a smaller loop filter capacitor and decreasing lock time of the PLL.

While the exemplary embodiments of the present invention have been described with respect to processes of circuits, the present invention is not so limited. As would be apparent to one skilled in the art, various functions of circuit elements may also be implemented in the digital domain as processing steps in a software program. Such software may be employed in, for example, a digital signal processor, micro-controller or general purpose computer.

The present invention can be embodied in the form of methods and apparatuses for practicing those methods. The present invention can also be embodied in the form of program code embodied in tangible media, such as floppy diskettes, CD-ROMs, hard drives, or any other machine-readable storage medium, wherein, when the program code is loaded into and executed by a machine, such as a computer, the machine becomes an apparatus for practicing the invention. The present invention can also be embodied in the form of program code, for example, whether stored in a storage medium, loaded into and/or executed by a machine, or transmitted over some transmission medium, such as over electrical wiring or cabling, through fiber optics, or via electromagnetic radiation, wherein, when the program code is loaded into and executed by a machine, such as a computer, the machine becomes an apparatus for practicing the invention. When implemented on a general-purpose processor, the program code segments combine with the processor to provide a unique device that operates analogously to specific logic circuits.

It will be further understood that various changes in the details, materials, and arrangements of the parts which have been described and illustrated in order to explain the nature of this invention may be made by those skilled in the art without departing from the principle and scope of the invention as expressed in the following claims.

What is claimed is:

1. A phase-locked loop (PLL) comprising:

a phase detector (PD) generating a PLL PD signal based on a difference in phase between a PLL input signal and a PLL feedback signal, wherein a circuit generates a control voltage from the PLL PD signal;

a voltage controlled oscillator (VCO) generating a PLL output signal having a frequency and phase based on the control voltage, the VCO including a ring oscillator having a plurality of stages and each stage providing a corresponding signal phase of the PLL output signal;

a multiplexer receiving two or more signal phases of the ring oscillator and providing one signal phase based on a select signal generated from the PLL feedback signal; and a feedback divider that clocks a count-by-N counter with the signal phase provided by the multiplexer to generate the PLL feedback signal, N a positive integer, wherein the counter 1) divides the signal corresponding to the selected signal phase during a cycle of N counts and 2) delays or advances the next cycle of N counts based on a difference between the current and next signal phase provided by the multiplexer.

2. The invention as recited in claim 1, wherein the circuit generating the control voltage comprises:

a charge pump generating an amount of charge corresponding to the PLL PD signal; and a loop filter accumulating the amount of charge to provide the control voltage.

3. The invention as recited in claim 1, further comprising an input divider clocking a count-by-R counter with a periodic input signal to generate the PLL input signal.

4. The invention as recited in claim 1, wherein a state machine generates the select signal based on the value of the count-by-N counter.

5. The invention as recited in claim 1, wherein a state machine generates the select signal based on a control signal, the control signal causing the select signal to either advance, delay, or maintain the signal phase provided to the feedback divider.

6. The invention as recited in claim 1, wherein the ring oscillator comprises an odd number of stages, each stage being an inverter.

7. The invention as recited in claim 1, wherein the ring oscillator includes an even number of stages, each stage being either an inverter or non-inverter, and the total number of inverter stages is an odd number.

8. The invention as recited in claim 1, wherein the PLL is embodied in an integrated circuit.

9. A method of implementing a phase-locked loop (PLL) comprising the steps of:

(a) generating 1) a PLL PD signal based on a difference in phase between a PLL input signal and a PLL feedback signal, and 2) a control voltage from the PLL PD signal;

(b) generating a PLL output signal having a frequency and phase based on the control voltage;

(c) providing a plurality of signal phases of the PLL output signal by a ring oscillator;

(d) selecting one signal phase based on a select signal generated from the PLL feedback signal;

(e) clocking a count-by-N counter with the selected signal phase to generate the PLL feedback signal, N a positive integer;

(f) dividing the signal corresponding to the selected signal phase during a cycle of N counts; and (g) delaying or advancing the next cycle of N counts based on a difference between the current and next signal phase selected in step (d).

10. The invention as recited in claim 9, further comprising dividing a reference signal by clocking a count-by-R counter with the reference signal to generate the PLL input signal.

11. The invention as recited in claim 9, wherein step (d) generates the select signal based on the value of the count-by-N counter.

12. The invention as recited in claim 9, wherein step (d) generates the select signal based on a control signal, the control signal causing the select signal to either advance, delay, or maintain the signal phase.

13. A circuit having a phase-locked loop (PLL) comprising:

a phase detector (PD) generating a PLL PD signal based on a difference in phase between a PLL input signal and a PLL feedback signal, wherein a circuit generates a control voltage from the PLL PD signal;

a voltage controlled oscillator (VCO) generating a PLL output signal having a frequency and phase based on the control voltage, the VCO including a ring oscillator having a plurality of stages and each stage providing a corresponding signal phase of the PLL output signal;

a multiplexer receiving two or more signal phases of the ring oscillator and providing one signal phase based on a select signal generated from the PLL feedback signal; and a feedback divider that clocks a count-by-N counter with the signal phase provided by the multiplexer to generate the PLL feedback signal, N a positive integer, wherein the counter 1) divides the signal corresponding to the selected signal phase during a cycle of N counts and 2) delays or advances the next cycle of N counts based on a difference between the current and next signal phase provided by the multiplexer.

14. The invention as recited in claim 13, wherein the circuit is embodied in an integrated circuit.

\* \* \* \* \*